US012566382B2

(12) United States Patent
Berendsen et al.

(10) Patent No.: US 12,566,382 B2
(45) Date of Patent: Mar. 3, 2026

(54) FLUID HANDLING SYSTEM, METHOD AND LITHOGRAPHIC APPARATUS

(71) Applicant: ASML NETHERLANDS B.V., Veldhoven (NL)

(72) Inventors: Christianus Wilhelmus Johannes Berendsen, Veldhoven (NL); Theodorus Wilhelmus Polet, Geldrop (NL); Erik Henricus Egidius Catharina Eummelen, Veldhoven (NL); Giovanni Luca Gattobigio, Eindhoven (NL); Koen Cuypers, Lommel (BE)

(73) Assignee: ASML NETHERLANDS B.V., Veldhoven (NL)

( * ) Notice: Subject to any disclaimer, the term of this patent is extended or adjusted under 35 U.S.C. 154(b) by 88 days.

(21) Appl. No.: 18/028,982

(22) PCT Filed: Nov. 25, 2021

(86) PCT No.: PCT/EP2021/083013
§ 371 (c)(1),
(2) Date: Mar. 28, 2023

(87) PCT Pub. No.: WO2022/135825
PCT Pub. Date: Jun. 30, 2022

(65) Prior Publication Data
US 2023/0333480 A1 Oct. 19, 2023

(30) Foreign Application Priority Data
Dec. 23, 2020 (EP) ..................................... 20216868

(51) Int. Cl.
*G03F 7/00* (2006.01)

(52) U.S. Cl.
CPC ...... *G03F 7/70341* (2013.01); *G03F 7/70858* (2013.01)

(58) Field of Classification Search
CPC ............. G03F 7/70341; G03F 7/70858; G03F 7/70975
See application file for complete search history.

(56) References Cited

U.S. PATENT DOCUMENTS 6,952,253 B2 10/2005 Lof et al.
7,466,392 B2 * 12/2008 Nagasaka ............... G03F 7/709
355/53

(Continued)

FOREIGN PATENT DOCUMENTS

CN 100462848 2/2009
CN 100565352 12/2009
(Continued)

OTHER PUBLICATIONS

International Search Report and Written Opinion issued in corresponding International Application No. PCT/EP2021/083013, dated Feb. 27, 2022.

(Continued)

*Primary Examiner* — Hung V Nguyen
(74) *Attorney, Agent, or Firm* — Pillsbury Winthrop Shaw Pittman, LLP

(57) ABSTRACT

A fluid handling system for a lithographic apparatus, wherein the fluid handling system is configured to confine immersion liquid to a liquid confinement space between a part of a projection system and a surface of a substrate in the lithographic apparatus so that a radiation beam projected from the projection system can irradiate the surface of the substrate by passing through the immersion liquid, the fluid handling system including a replaceable plate with an outer surface that includes a plurality of fluid openings configured for supply and/or extraction of immersion liquid and/or gas (Continued)

in a channel between the fluid handling system and the substrate, wherein the outer surface is coated.

20 Claims, 10 Drawing Sheets

(56)                    References Cited

U.S. PATENT DOCUMENTS

| | | | | |
|---|---|---|---|---|
| 8,587,762 | B2 * | 11/2013 | Streefkerk | G03F 7/70341 |
| | | | | 355/53 |
| 8,634,055 | B2 * | 1/2014 | Poon | G03B 27/52 |
| | | | | 355/53 |
| 8,993,220 | B2 * | 3/2015 | Dziomkina | G03F 7/70716 |
| | | | | 355/71 |
| 9,939,739 | B2 * | 4/2018 | Kobayashi | G03F 9/7096 |
| 10,955,757 | B2 * | 3/2021 | Ten Kate | G03F 7/70716 |
| 2007/0216881 | A1 | 9/2007 | Van Der Schoot et al. | |
| 2010/0283980 | A1 | 11/2010 | Sato et al. | |
| 2011/0255062 | A1 | 10/2011 | Philips et al. | |
| 2013/0149649 | A1 * | 6/2013 | Polet | G03F 7/70341 |
| | | | | 355/72 |

FOREIGN PATENT DOCUMENTS

| | | |
|---|---|---|
| CN | 102937777 | 2/2013 |
| CN | 103176368 | 6/2013 |
| CN | 103969964 | 8/2014 |
| CN | 104597720 | 5/2015 |
| CN | 104965392 | 10/2015 |
| CN | 105045046 | 11/2015 |
| CN | 107991843 | 5/2018 |
| EP | 2042930 | 4/2009 |
| JP | 2009088508 | 4/2009 |
| JP | 2011228701 | 11/2011 |
| JP | 2012524983 | 10/2012 |
| WO | 99/49504 | 9/1999 |

OTHER PUBLICATIONS

Office Action issued in corresponding Japanese Patent Application No. 2023-624128, dated Sep. 16, 2025.

* cited by examiner

Fig. 2c

FLUID HANDLING SYSTEM, METHOD AND LITHOGRAPHIC APPARATUS

CROSS-REFERENCE TO RELATED APPLICATIONS

This application is the U.S. national phase entry of PCT Patent Application No. PCT/EP2021/083013 filed Nov. 25, 2021, which claims priority of European Patent Application No. 20216868.8 which was filed on Dec. 23, 2020, and which is incorporated herein in its entirety by reference.

FIELD

The present invention relates to a fluid handling system and a device manufacturing method.

The present invention also relates to the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Further improvements in the resolution of smaller features may be achieved by providing an immersion fluid having a relatively high refractive index, such as water, on the substrate during exposure. The effect of the immersion fluid is to enable imaging of smaller features since the exposure radiation will have a shorter wavelength in the fluid than in gas. The effect of the immersion fluid may also be regarded as increasing the effective numerical aperture (NA) of the system and also increasing the depth of focus.

The immersion fluid may be confined to a localized area between the projection system of the lithographic apparatus and the substrate by a fluid handling structure. The use of such immersion fluid can lead to the presence of droplets on the surface of the substrate. Such droplets can be an issue because they can cause drying spots on the substrate and because when a droplet hits a meniscus of immersion liquid, this can lead to formation of a bubble due to entrapped gas in the immersion liquid. A bubble in the immersion liquid can lead to printed defects on the substrate. The likelihood of such bubbles being introduced can be reduced by reducing the relative speed of the substrate.

There are openings in the fluid handling structure for providing flows of immersion fluid and gas. Maintenance of the fluid handling structure includes operations for clearing blockages in the openings. Maintenance of the fluid handling structure may reduce the availability of the lithographic apparatus.

SUMMARY

It is an object of the present invention to provide a fluid handling system with reduced downtime due to maintenance.

According to a first aspect of the present invention, there is provided a fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a replaceable plate with an outer surface that comprises a plurality of fluid openings configured for supply and/or extraction of immersion liquid and/or gas in a channel between the fluid handling system and the substrate; wherein the outer surface is coated.

According to a second aspect of the invention, there is provided a fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a plurality of replaceable plates; wherein each plate comprises an outer surface that comprises a plurality of fluid openings configured for supply and/or extraction of immersion liquid and/or gas in a channel between the fluid handling system and the substrate.

According to a third aspect of the invention, there is provided a fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a replaceable plate for supply and/or extraction of immersion liquid and/or gas in a channel between the fluid handling system and the substrate; wherein the plate comprises a porous member.

According to a fourth aspect of the invention, there is provided a fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: one or more bumper plates; wherein an outer surface of each bumper plate provides a boundary surface between the fluid handling system and a channel between the fluid handling system and the substrate; and a surface of a bumper plate provides the minimum separation across the channel between the fluid handling system and the substrate.

According to a fifth aspect of the invention, there is provided a lithographic apparatus according to any of the first to fourth aspects.

Further embodiments, features and advantages of the present invention, as well as the structure and operation of the various embodiments, features and advantages of the present invention, are described in detail below with reference to the accompanying drawings.

DESCRIPTION OF THE DRAWINGS

Embodiments of the invention will now be described, by way of example only, with reference to the accompanying schematic drawings, in which corresponding reference symbols indicate corresponding parts, and in which:

FIGS. 2A, 2B, 2C and 2D each depict, in cross section, two different versions of a fluid handling system with different features illustrated on the left hand side and the right hand side of each version, which may extend around the complete circumference;

The features shown in the figures are not necessarily to scale, and the size and/or arrangement depicted is not limiting. It will be understood that the figures include optional features which may not be essential to the invention. Furthermore, not all of the features of the apparatus are depicted in each of the figures, and the figures may only show some of the components relevant for describing a particular feature.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
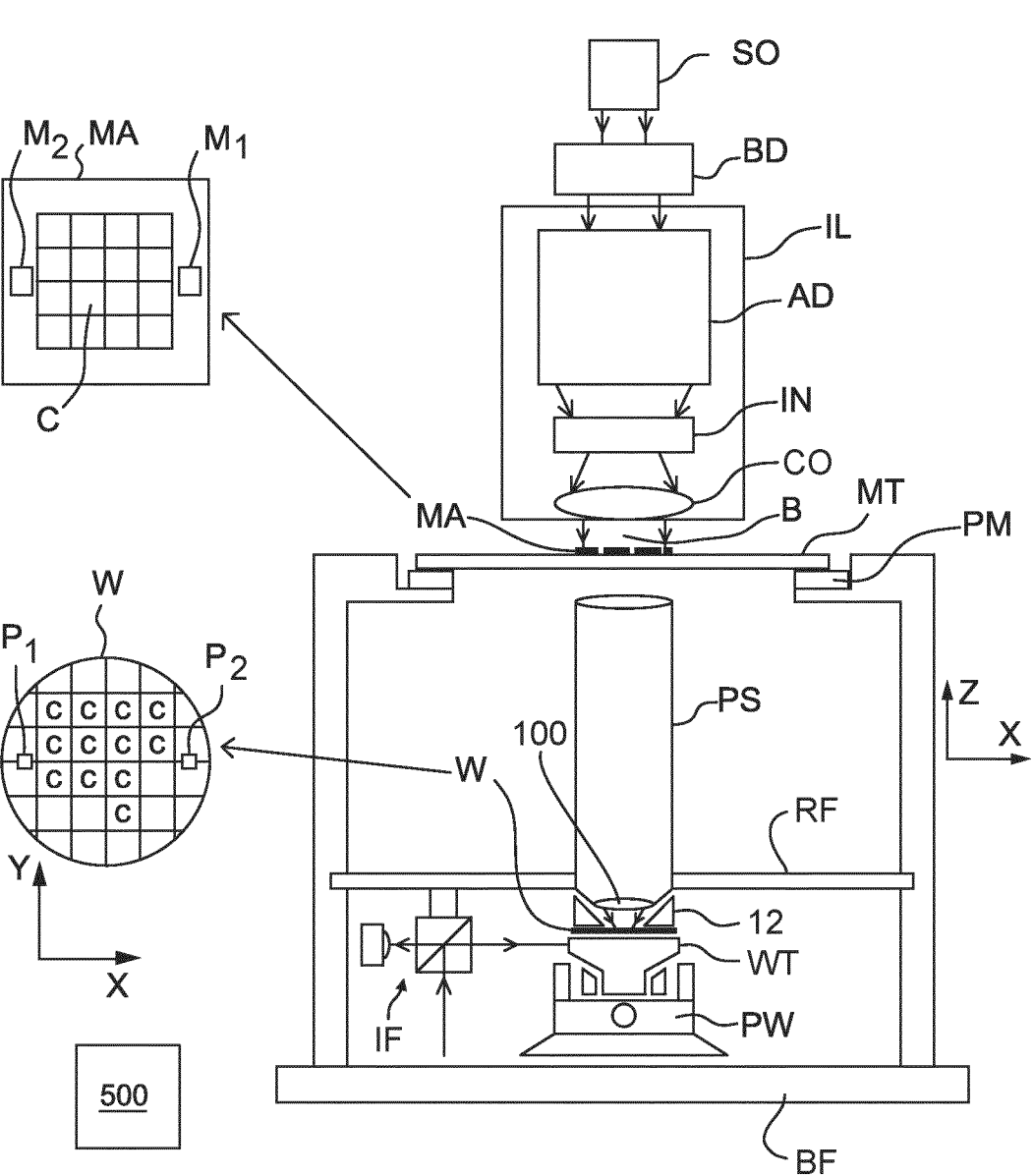
FIG. 1 depicts the schematic overview of the lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W. A controller 500 controls the overall operation of the apparatus. Controller 500 may be a centralised control system or a system of multiple separate sub-controllers within various sub-systems of the lithographic apparatus.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 11 between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in figures). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in the immersion space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid.

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the immersion space 11 between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The immersion space 11 filled by the immersion liquid is smaller in plan than the top surface of the substrate W and the immersion space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element 100. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the immersion space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the immersion space 11 and which operate depending on the relative motion of the stage beneath the projection system PS. In more recent designs, the fluid handling structure extends along at least a part of a boundary of the immersion space 11 between the final element 100 of the projection system PS and the substrate support WT or substrate W, so as to in part define the immersion space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system, fluid removal system, liquid confinement structure, etc.

As a barrier member, the fluid handling structure 12 is a barrier to the flow of the immersion liquid from the immersion space 11. As a liquid confinement structure, the structure confines the immersion liquid to the immersion space 11. As a seal member, sealing features of the fluid handling structure 12 form a seal to confine the immersion liquid to the immersion space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element 100 is at least partly surrounded by the fluid handling structure 12. The fluid handling structure 12 may confine the immersion liquid under the final element 100 and above the facing surface.

FIGS. 2a, 2b, 2c and 2d show different features which may be present in variations of a fluid handling system. The designs may share some of the same features as FIGS. 2a, 2b, 2c and 2d unless described differently. The features described herein may be selected individually or in combination as shown or as required. The figures depict different versions of a fluid handling system with different features illustrated on the left hand side and the right hand side, which may extend around the complete circumference. Thus, for example, the fluid handling system may have the same features extending around the complete circumference. For example, the fluid handling system may have only the features of the left hand side of FIG. 2a, or the right hand side of FIG. 2a, or the left hand side of FIG. 2b, or the right hand side of FIG. 2b, or the left hand side of 2c, or the right hand side of 2c, or the left hand side of 2d, or the right hand side of 2d. Alternatively, the fluid handling system may be provided with any combination of features from these figures at different locations around the circumference. The fluid handling system may comprise the fluid handling structure 12 as described in the variations below.

Figure 2A:
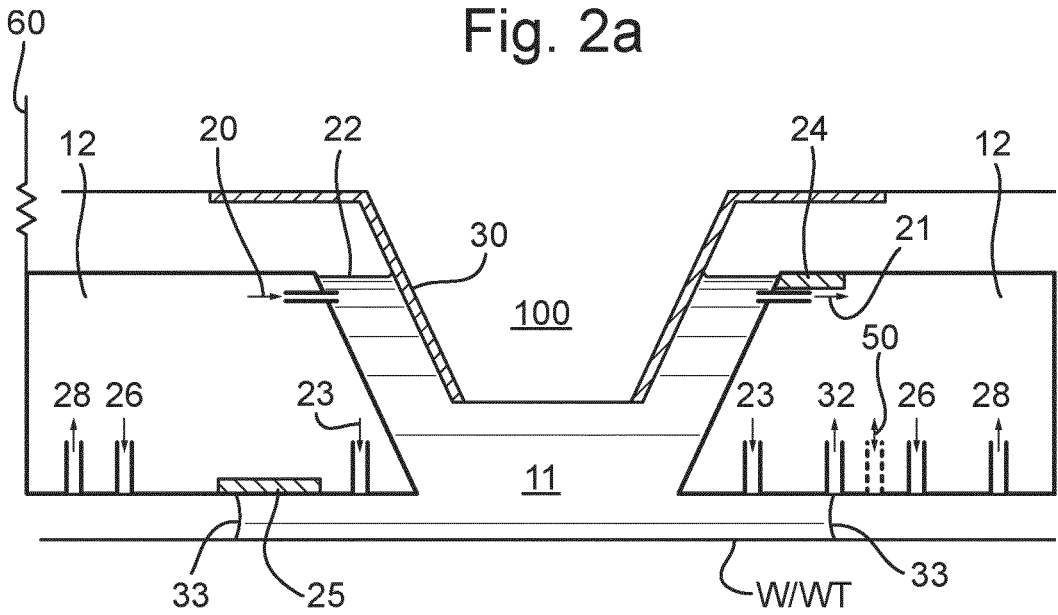

FIG. 2a shows a fluid handling structure 12 around the bottom surface of the final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface may have complementary shapes. A top surface of the fluid handling structure 12 may be substantially planar. The fluid handling structure 12 may fit around the frusto-conical shape of the final element 100. A bottom surface of the fluid handling structure 12 may be substantially planar and in use the bottom surface may be parallel with the facing surface of the substrate support WT and/or substrate W. Thus, the bottom surface of the fluid handling structure 12 may be referred to as a surface facing the surface of the substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. The immersion space 11 is therefore defined between the inner surface of the fluid handling structure 12, the planar surface of the frusto-conical portion and the facing surface. During use, the immersion space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the immersion space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the bottom surface of the fluid handling structure 12. The under supply opening 23 may surround the path of the radiation beam B and it may be formed of a series of openings in an array or a single slit. The immersion liquid is supplied to fill the immersion space 11 so that flow through the immersion space 11 under the projection system PS is laminar. The supply of the immersion liquid from the under supply opening 23 additionally prevents the ingress of bubbles into the immersion space 11. This supply of the immersion liquid may function as a liquid seal.

The immersion liquid may be recovered from a recovery opening 21 formed in the inner-surface. The recovery of the immersion liquid through the recovery opening 21 may be by application of an underpressure; the recovery through the recovery opening 21 as a consequence of the velocity of the immersion liquid flow through the immersion space 11; or the recovery may be as a consequence of both. The recovery opening 21 may be located on the opposite side of the supply opening 20, when viewed in plan. Additionally or alternatively, the immersion liquid may be recovered through an overflow recovery 24 located on the top surface of the fluid handling structure 12. The supply opening 20 and recovery opening 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pinning openings 32 through which the immersion liquid is recovered. The pinning openings 32 may recover the immersion liquid in a two phase flow.

Optionally radially outward, with respect to the inner-surface of the fluid handling structure 12, is a gas knife opening 26. Gas may be supplied through the gas knife opening 26 at elevated speed to assist liquid confinement of the immersion liquid in the immersion space 11. The supplied gas may be humidified and it may contain substantially carbon dioxide. Radially outward of the gas knife opening 26 is a gas recovery opening 28 for recovering the gas supplied through the gas knife opening 26.

Further openings, for example open to atmosphere or to a gas source or to a vacuum, may be present in the bottom surface of the fluid handling structure 12, i.e. in the surface of the fluid handling structure 12 facing the substrate W. An example of such an optional further opening 50 is shown in dashed lines on the right hand side of FIG. 2a. As shown, the further opening 50 may be a supply or extraction member, which is indicated by the double-headed arrow. For example, if configured as a supply, the further opening 50 may be connected to a liquid supply or a gas supply as with any of the supply members. Alternatively, if configured as an extraction, the further opening 50 may be used to extract fluid, and may for example, be connected to atmosphere or to a gas source or to a vacuum. For example, the at least one further opening 50 may be present between gas knife opening 26 and gas recovery opening 28, and/or between pinning openings 32 and gas knife opening 26.

The two different versions of the fluid handling structure 12 of the left and right sides of FIG. 2a pin the meniscus 33. The version of the fluid handling structure 12 on the right hand side of FIG. 2a may pin the meniscus 33 at a position that is substantially fixed with respect to the final element 100, due to the fixed position of the pinning opening 32. The version of the fluid handling structure 12 on the left hand side of FIG. 2a may pin the meniscus 33 below the recovery opening 25, and thus the meniscus 33 may move along the length and/or width of the recovery opening 25. For the radiation beam B to be directed to a full side of the substrate W under exposure, the substrate support WT supporting the substrate W is moved relative to the projection system PS. To maximize the output of substrates W exposed by the lithographic apparatus, the substrate support WT (and so substrate W) is moved as fast as possible. However, there is a critical relative speed (often referred to as a critical scan speed) above which the meniscus 33 between the fluid handling structure 12 and the substrate W becomes unstable. An unstable meniscus 33 has a greater risk of losing immersion liquid, for example in the form of one or more droplets. Furthermore, an unstable meniscus 33 has a greater risk of resulting in the inclusion of gas bubbles in the immersion liquid, especially when the confined immersion liquid crosses the edge of the substrate W.

A droplet present on the surface of the substrate W may apply a thermal load and may be a source of defectivity. The droplet may evaporate leaving a drying stain, it may move transporting contamination such as a particle, it may collide with a larger body of immersion liquid introducing a bubble of gas into the larger body and it may evaporate, applying the thermal heat load to the surface on which it is located. Such a thermal load could be a cause of distortion and/or a source of a positioning error if the surface is associated with positioning of components of the lithographic apparatus relative to the substrate W being imaged. A formation of a droplet on a surface is therefore is undesirable. To avoid formation of such a droplet, the speed of the substrate support WT is thus limited to the critical scan speed at which the meniscus 33 remains stable. This limits the throughput of the lithographic apparatus.

The left hand side of the fluid handling system in FIG. 2a may comprise a spring 60. The spring 60 may be an adjustable passive spring configured to apply a biasing force to the fluid handling structure 12 in the direction of the substrate W. Thus, the spring 60 can be used to control the height of the fluid handling structure 12 above the substrate W. Such adjustable passive springs are described in U.S. Pat. No. 7,199,874 which is herein incorporated by reference in its entirety. Other bias devices may also be appropriate, for example, using an electromagnetic force. Although the spring 60 is shown with the left hand side of FIG. 2a, it is optional and does not need to be included with the other features of the left hand side of FIG. 2a. The spring 60 is not shown on any of the other figures, but could also be included with the other variations of the fluid handling system described in relation to FIG. 2a, 2b, 2c, or 2d.

Figure 2B:
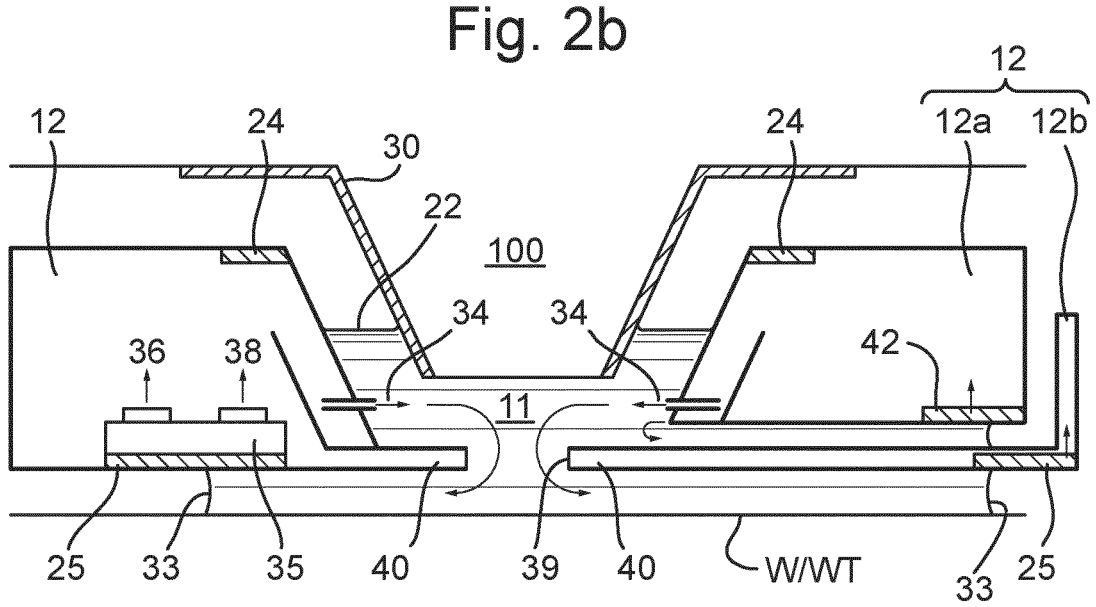

FIG. 2b shows two different versions of the fluid handling structure 12 on its left side and on its right side, which allow movement of the meniscus 33 with respect to the final element 100. The meniscus 33 may move in the direction of the moving substrate W. This decreases the relative speed between the meniscus 33 and the moving substrate W, which may result in improved stability and a reduced risk of breakdown of the meniscus 33. The speed of the substrate W at which the meniscus 33 breaks down is increased so as to allow faster movement of the substrate W under the projection system PS. Throughput is thus increased.

Features shown in FIG. 2b which are common to FIG. 2a share the same reference numbers. The fluid handling structure 12 has an inner surface which complements the conical surface of the frusto-conical shape. The bottom surface of the fluid handling structure 12 is closer to the facing surface than the bottom planar surface of the frusto-conical shape.

Immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the immersion space 11 through recovery openings 25, in the bottom surface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. The immersion liquid may be recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the bottom surface of fluid handling structure 12 extends into the immersion space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

The fluid handling structure 12 may be in two parts as shown on the right hand side of FIG. 2b: an inner part 12a and an outer part 12b. The inner part 12a and the outer part 12b may move relatively to each other, mainly in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12*a* and the outer part 12*b*.

The two different versions of the fluid handling structure of FIG. 2*b* thus allow for movement of the meniscus 33 in the same direction as the substrate W, enabling faster scan speeds and increased throughput of the lithographic apparatus. However, the migration speed of meniscus 33 over the surface of the recovery opening 25 in the fluid handling structure 12 of the left side of FIG. 2*b* may be slow. The fluid handling structure 12 of the right side of FIG. 2*b* allows for quicker movement of the meniscus 33, by moving the outer part 12*b* with respect to the inner part 12*a* and the final element 100. However, it may be difficult to control the intermediate recovery 42 so as to ensure that enough immersion liquid is provided between the inner part 12*a* and the outer part 12*b* to prevent contact therebetween.

Figure 2C:
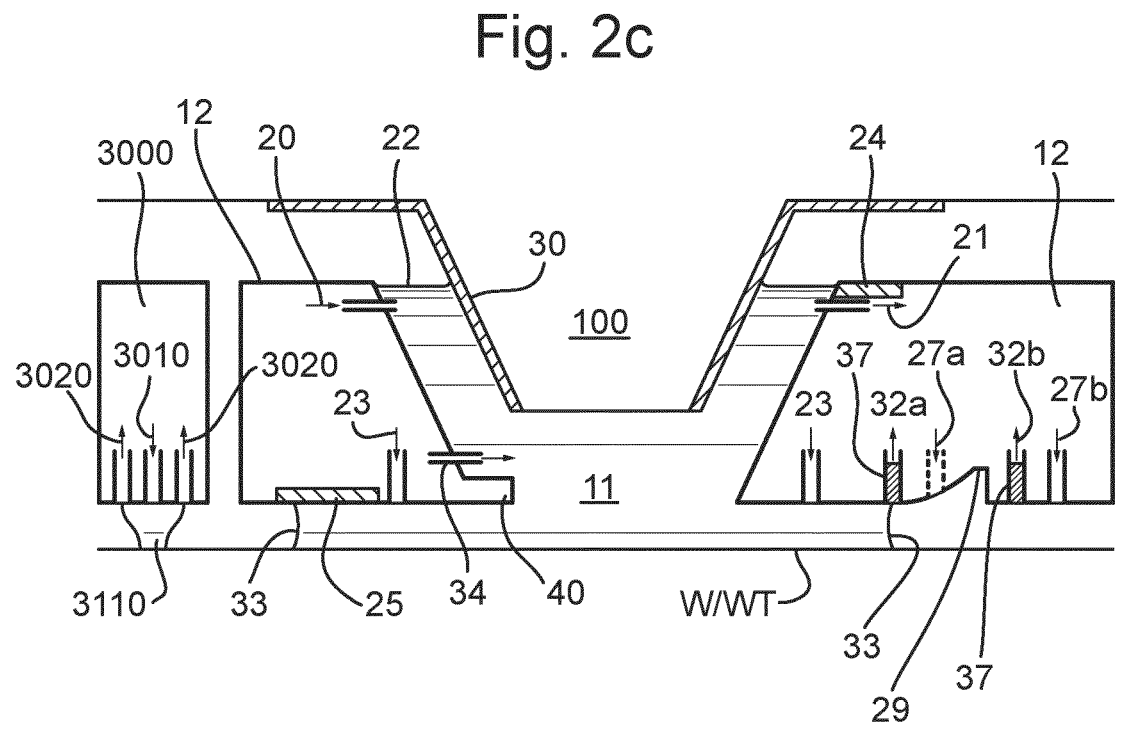

FIG. 2*c* shows two different versions of the fluid handling structure 12 on its left side and on its right side, which may be used to pin the meniscus 33 of the immersion liquid to the fluid handling structure 12 as described above in relation to FIGS. 2*a* and/or 2*b*. Features shown in FIG. 2*c* which are common to FIGS. 2*a* and/or 2*b* share the same reference numbers.

The fluid handling structure 12 has an inner surface which compliments the conical surface of the frusto-chronical shape. The bottom surface of the fluid handling structure 12 is closer to the facing surface than the bottom planar surface of the frusto-chronical shape. Immersion liquid is supplied to the immersion space 11 delivered through an opening formed in a surface of the fluid handling structure 12. The immersion liquid may be supplied through a supply opening 34 in the inner surface of the fluid structure 12. Alternatively or additionally, the immersion liquid may be supplied through a supply opening 20 in the inner surface of the fluid structure 12. Alternatively or additionally, the immersion liquid is supplied through the under supply opening 23. The immersion liquid may be recovered via an extraction member, for example, via recovery opening 21 formed in the inner-surface and/or overflow recovery 24 and/or one or more openings in a surface of the fluid handling structure 12 as described below.

The two different versions of the fluid handling structure 12 of the left and right sides of FIG. 2*c* pin the meniscus 33. The version of the fluid handling structure 12 on the right hand side of FIG. 2*c* may pin the meniscus 33 at a position that is substantially fixed with respect to the final element 100, due to the fixed position of the recovery opening 32*a*. The version of the fluid handling structure 12 on the left hand side of FIG. 2*c* may pin the meniscus 33 below the recovery opening 25, and thus the meniscus 33 may move along the length and/or width of the recovery opening 25.

As described above in relation to FIG. 2*b*, an inner periphery of the bottom surface of fluid handling structure 12 may extends into the immersion space 11 away from the inner surface to form a plate 40 as shown on the left hand side. As described above, this may form a small aperture, and may isolate the immersion liquid at either side and/or cause immersion liquid to flow inwards towards the aperture, through the inner aperture and then under the plate 40 radially outwardly towards the surrounding the recovery openings 25. Although this features is shown on the left hand side in FIG. 2*c*, it is optional in combination with the other features shown. Preferably, as shown on the left hand side, immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B. Alternatively or additionally, the immersion liquid may be supplied through a supply opening 20 in the inner surface of the fluid structure 12. Alternatively or additionally, the immersion liquid is supplied through the under supply opening 23. Although the supply openings 34 are the preferred liquid supply, any combination of supply openings 34, supply openings 20 and/or under supply openings 23 may be provided.

As shown on the left hand side of FIG. 2*c*, a fluid handling system may comprise the fluid handling structure 12 as described above and a further device 3000. The fluid handling structure 12 may have an extraction member, such as recovery opening 25, and a liquid supply opening, such as the under supply opening 23. It will be understood that the fluid handling structure 12 may comprise any configuration as disclosed in relation to the left hand of FIG. 2*a*, the right hand side of FIG. 2*a*, the left hand side of FIG. 2*b*, the right hand side of FIG. 2*b* or (as described below) the right hand side of FIG. 2*c*, in combination with the further device 3000.

The further device 3000 may otherwise be referred to as a droplet catcher. The further device 3000 is provided to reduce occurrence of liquid on the surface of the substrate W after the fluid handling structure 12 has moved over the surface. The further device 3000 may comprise a liquid supply member 3010 and at least one extraction member 3020. The at least one extraction member 3020 may be formed in a shape surrounding the at least one supply member 3010 in plan. The at least one liquid supply member 3010 may be configured to provide a further liquid to a space 3110 between at least a part of the further device 3000 and the surface of the substrate W. The further device 3000 may be configured to recover at least some of the liquid via the at least one extraction member 3020. The further device 3000 may be used to incorporate any liquid left on the surface of the substrate W with the liquid in the space 3110 and then use the further device 3000 to extract the liquid such that the amount of liquid remaining on the surface of the substrate W is reduced.

The further device 3000 is shown as a separate device from the fluid handling structure 12 in FIG. 2*c*. The further device 3000 may be positioned adjacent to the fluid handling structure 12. Alternatively, the further device 3000 may be part of, i.e. integral to, the fluid handling structure 12 (as in FIG. 3*d*, however, either arrangement can be selected).

The further device 3000 may be configured to provide a liquid to the space 3110 which is separate from the liquid provided by the fluid handling structure 12.

Additionally or alternatively, the fluid handling structure 12 may have the components as shown on the right hand side of FIG. 2*c*. More specifically, the fluid handling structure 12 may comprise the at least one liquid supply member, two extraction members (e.g., recovery openings 32*a* and 32*b*) and two gas supply members (e.g., gas supply openings 27*a* and 27*b*) formed on the surface of the fluid handling structure 12. Gas supply opening 27*a* can be omitted, i.e. is optional. The at least one liquid supply member may be the same as the under supply opening 23 in the bottom surface of the fluid handling structure 12 described above or the supply opening 20 or liquid supply openings 34 formed on the inner surface of the fluid handling structure 12 described in relation to left hand side of FIG. 2*b*. The liquid supply member, the extraction members and the gas supply members may be formed on the surface of the fluid handling structure 12. Specifically, these components may be formed on a surface of the fluid handling structure 12 facing the substrate W, i.e. the bottom surface of the fluid handling structure 12.

At least one of the two extraction members may comprise a porous material 37 therein. The porous material 37 may be provided within an opening, e.g., recovery opening 32a through which fluid handling structure 12 extracts fluid from below the fluid handling structure 12 and may recover the immersion liquid in a single phase flow. The other of the two extraction members, e.g., recovery opening 32b may recover the immersion fluid as a dual phase extractor. The porous material 37 does not need to be flush with the bottom surface of the fluid handling structure 12.

Specifically, the fluid handling structure 12 may comprise the liquid supply member (e.g., under supply opening 23), with a first extraction member (e.g., recovery opening 32a) radially outwards of the liquid supply member, and a first gas supply member (e.g., gas supply opening 27a) radially outwards of the first extraction member, and the second extraction member (e.g., recovery opening 32b) radially outwards of the first gas supply member, and a second gas supply member (e.g., gas supply opening 27b) radially outwards of the second extraction member. Similar to FIG. 2a, further openings, for example open to atmosphere or to a gas source or to a vacuum, may be present in the bottom surface of the fluid handling structure 12 as described previously (in relation to the fluid handling structure 12).

For example, at least one further opening (not shown) may be provided in the bottom surface of the fluid handling structure 12. The further opening is optional. The further opening may be arranged between the first extraction member (e.g., recovery opening 32a) and the first gas supply member (e.g., gas supply opening 27a) as described in the arrangement above. Alternatively or additionally, the further opening may be arranged between the second extraction member (e.g., recovery opening 32b) and the second gas supply member (e.g., gas supply opening 27b) as described in the arrangement above. The further opening may be the same as further opening 50 described above.

Optionally, the fluid handling structure 12 comprises a recess 29. The recess 29 may be provided between the recovery opening 32a and recovery opening 32b or gas supply opening 27a and recovery opening 32b. The shape of the recess 29 may be uniform around the fluid handling structure 12 and may optionally contain an inclined surface. In the case of the recess 29 provided between the recovery opening 32a and recovery opening 32b, the gas supply opening 27b may be provided on the inclined surface as shown in FIG. 2c. In the case of the recess 29 provided between the supply opening 27a and recovery opening 32b, the gas supply opening 27b may be provided on the inclined surface or a part of the bottom surface of the fluid handling structure 12 which is parallel to the surface of the substrate W. Alternatively, the shape of the recess 29 may vary around the circumference of the fluid handling structure 12. The shape of the recess 29 may be varied to alter the impact of gas supplied from the gas supply members on the fluid below the fluid handling structure 12.

Figure 2D:
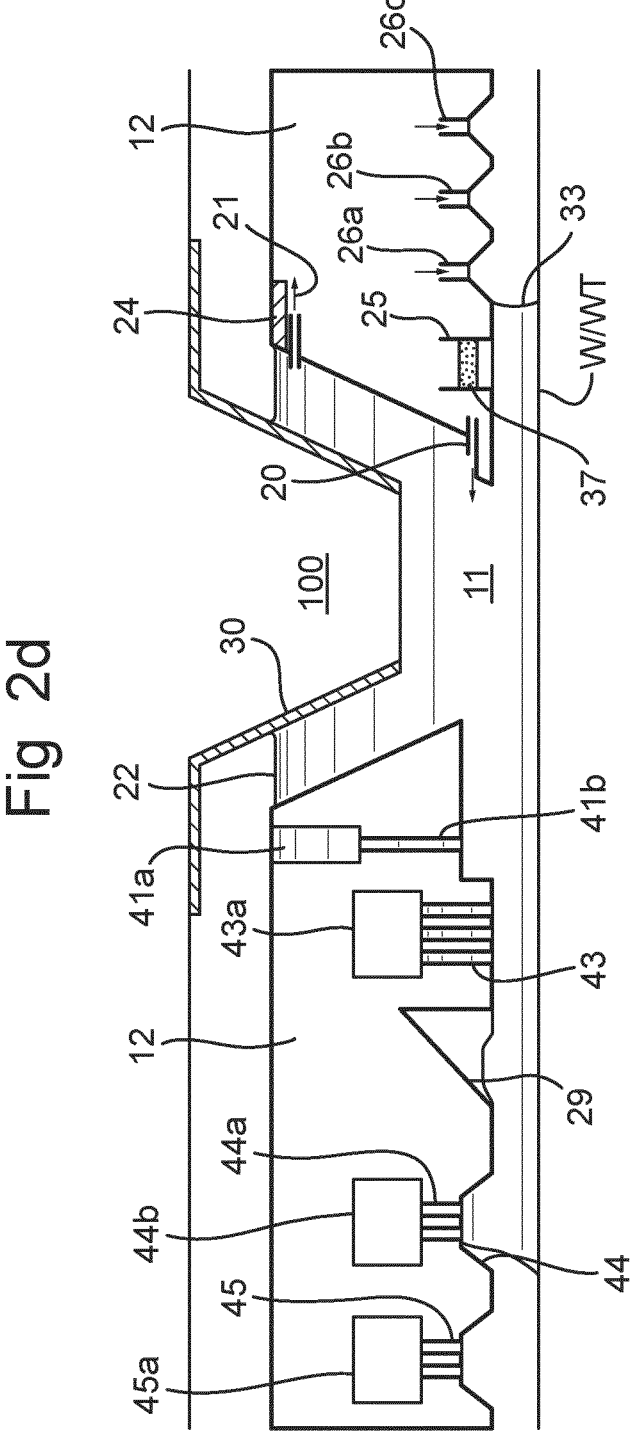

FIG. 2d shows, in its left and right halves, two different versions of the fluid handling structure 12. The fluid handling structure 12 of the left half of FIG. 2d has a liquid injection buffer 41a, which holds a buffer amount of immersion liquid, and liquid injection holes 41 which supply immersion liquid from the liquid injection buffer to the space 11. Outwardly of the liquid injection holes 41 are inner liquid recovery apertures 43 for conducting liquid to an inner recovery buffer 43a which is provided with a porous member. A recess 29 similar to that described relating to FIG. 2c is provided outward of the inner liquid recovery apertures 43. Outward of the recess 29, in the lower face of the fluid handling structure 12 is a gas guiding groove 44 into which open outer recovery holes 44a. The outer recovery holes 44a lead a two-phase recovery flow to outer recovery buffer 44b which is also provided with a porous member. Outermost are gas sealing holes 45 which communicate between a gas sealing buffer volume 45a and the space underneath the fluid handling structure 12 to provide a gas flow to contain the immersion liquid.

The fluid handling structure 12 of the right half of FIG. 2d has a liquid supply opening 20 in the inner inclined face thereof. In the underside of the fluid handling structure 12 there are (from inner side to outer side) an extraction opening 25 provided with a porous member 37; a first gas knife opening 26a, a second gas knife opening 26b and a third gas knife opening 26c. Each of these openings opens into a groove in the underside of the fluid handling structure 12 that provides a buffer volume. The outermost part of the fluid handling structure 12 is stepped so as to provide a greater separation between the fluid handling structure 12 and the substrate W.

FIGS. 2a-2d show examples of different configurations which can be used as part of a fluid handling system. It will be understood that the examples provided above refer to specific extraction members and recovery members, but it is not necessary to use the exact type of extraction member and/or recovery member. In some cases different terminology is used to indicate the position of the member, but the same functional features may be provided. Examples of the extraction member referred to above include recovery opening 21, overflow recover 24, recovery opening 25 (possibly comprising a porous plate and/or the chamber 35), gas recovery opening 28, pinning opening 32, recovery opening 32a, recovery opening 32b and/or the intermediate recovery 42. Examples of the supply member referred to above include supply opening 20, under supply opening 23, gas knife opening 26, gas supply opening 27a, gas supply opening 27b, and/or supply openings 34. In general, an extraction member used to extract/recover fluid, liquid or gas is interchangeable with at least any of the other examples used which extract/recover fluid, liquid or gas respectively. Similarly, a supply member used to supply fluid, liquid or gas is interchangeable with at least any of the other examples used which supply fluid, liquid or gas respectively. The extraction member may extract/recover fluid, liquid or gas from a space by being connected to an underpressure which draws the fluid, liquid or gas into the extraction member. The supply member may supply fluid, liquid or gas to the space by being connected to a relevant supply.

As previously described, although use of immersion fluid/liquid is beneficial for improving resolution of smaller features on a substrate, there are also issues with the use of immersion fluid/liquid relating to defects being introduced on the substrate.

In general, when immersion liquid is used, droplets of the immersion liquid may be left behind on the surface of the substrate W. The meniscus 33 at the edge of the immersion liquid may collide with any droplets on the surface of the substrate W. When a droplet hits the meniscus 33, gas may be entrapped within the immersion liquid. This results in a bubble in the immersion liquid. Formation of bubbles in the immersion liquid can lead to defects on the substrate W. Droplets that remain on the surface of the substrate W may cause drying spots and/or affect the chemical properties of the resist, also leading to defects.

It is known that the incidence of droplets increases with speed of movement of the substrate W relative to the fluid handling system. In some cases there is no or negligible droplet formation below a critical scan speed and significant droplet formation above the critical scan speed. The critical scan speed is related to the static receding contact angle between the immersion liquid and the resist provided on the substrate W. Increasing the static receding contact angle increases the critical scan speed. Since the critical scan speed may be a limiting factor on throughput of the lithographic apparatus it is desirable to increase the critical scan speed. Efforts to increase the critical scan speed have included increasing the static receding contact angle by changing the formulation of the resists or by providing a top coat above the resist.

Figure 3A:
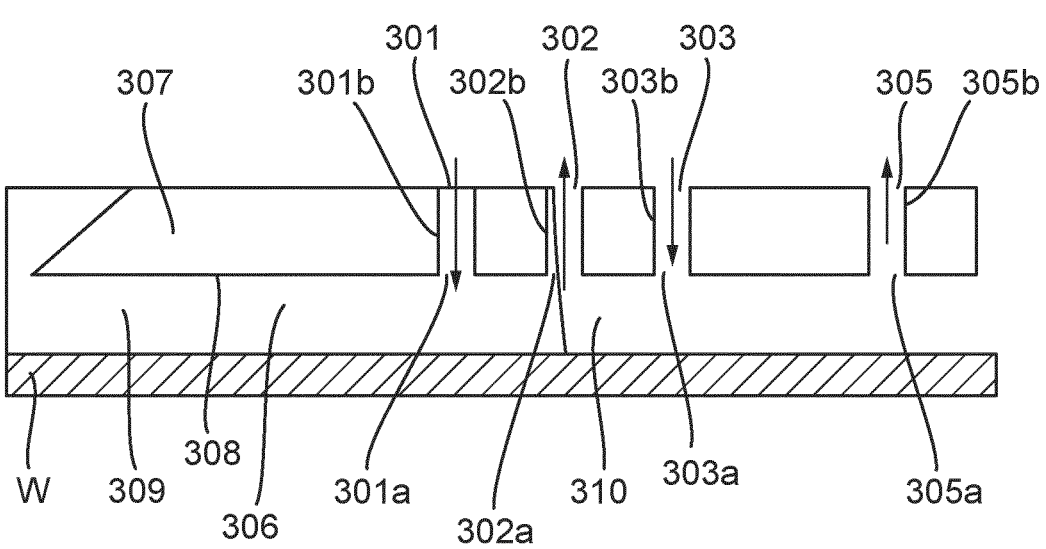
FIGS. 3A, 3B and 3C show part of a fluid handling system and substrate in a lithographic apparatus.
Figure 3B:
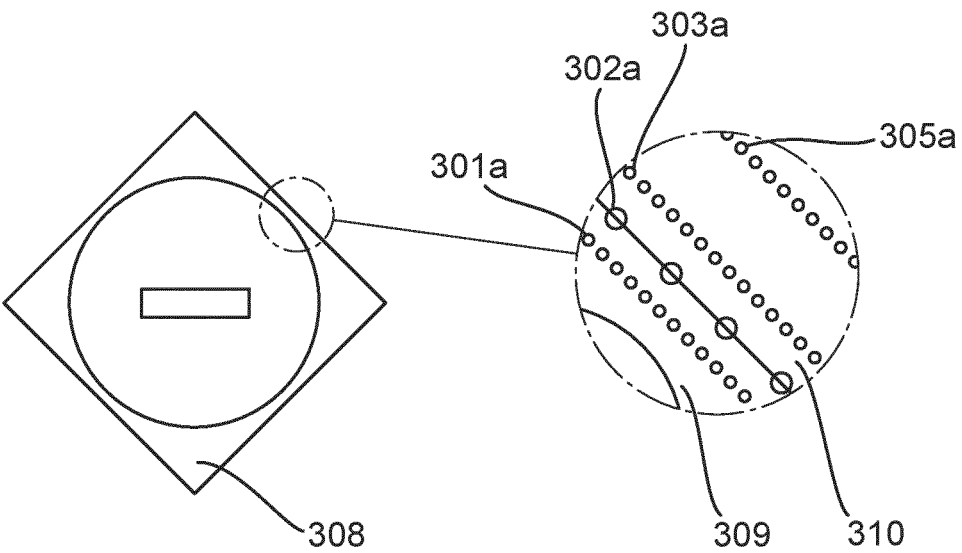
Figure 3C:
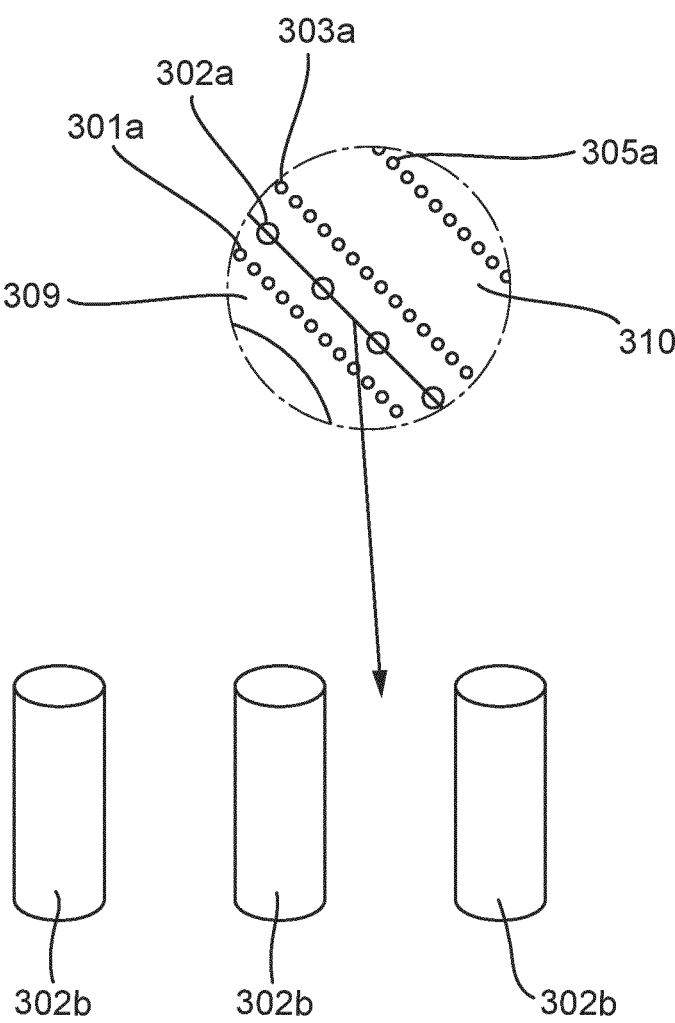

FIGS. 3A to 3C show part of a fluid handling system and substrate W in a lithographic apparatus. As shown in FIG. 3A, there is a channel 306 between the fluid handling system and the substrate W. The channel 306 may comprise immersion liquid 309 and/or gas 310. The part of the fluid handling system that abuts the channel 306 may be referred to as fluid handling structure 307. FIG. 3B shows the surface of the fluid handling structure 307 that provides a surface of the channel 306 and this surface may be referred to as a damper surface 308.

The fluid handling structure 307 comprises a first fluid supply member 301. The first fluid supply member 301 comprises a first fluid supply conduit 301b and a first fluid supply opening 301a in the damper surface 308. The first fluid supply member 301 may be the under supply opening 23 as described earlier with reference to at least FIGS. 2A and 2C.

The fluid handling structure 307 also comprises a first fluid extraction member 302. The first fluid extraction member 302 comprises a first fluid extraction conduit 302b and a first fluid extraction opening 302a in the damper surface 308. The first fluid extraction member 302 may be the pinning opening 32, or recovery opening 32a, as described earlier with reference to at least FIGS. 2A and 2C.

The fluid handling structure 307 may comprise a second fluid supply member 303. The second fluid supply member 303 comprises a second fluid supply conduit 303b and a second fluid supply opening 303a in the damper surface 308. The second fluid supply member 303 may be the gas knife opening 26, or gas supply opening 27a, as described earlier with reference to at least FIGS. 2A and 2C.

The fluid handling structure 307 may comprise a second fluid extraction member 305. The second fluid extraction member 305 comprises a second fluid extraction conduit 305b and a second fluid extraction opening 305a in the damper surface 308. The second fluid extraction member 305 may be the gas recovery opening 28, or recovery opening 32b, as described earlier with reference to at least FIGS. 2A and 2C.

Although not shown in FIGS. 3A to 3C, the fluid handling structure 307 may comprise any number of further openings. For example, the fluid handling structure 307 may comprise a third fluid supply member. The third fluid supply member may be located between the second fluid supply member 303 and the second fluid extraction member 305. The third fluid supply member may comprise a third fluid supply conduit and a third fluid supply opening in the damper surface 308.

In FIG. 3A, the damper surface 308 is substantially planar and substantially parallel to the surface of the substrate W. Parts of the damper surface 308 may alternatively be slanted, or elevated, so that the distance between the fluid handling structure 307 and the substrate W varies.

FIG. 3B shows a schematic plan view of the damper surface 308 of the fluid handling structure 307. There is a plurality of fluid openings 301a, 302a, 303a and 305a arranged in the damper surface 308. The plurality of fluid openings 301a, 302a, 303a and 305a are arranged in a plurality of different sets of openings.

FIG. 3C shows a schematic plan view of the damper surface 308 of the fluid handling structure 307 as well as some of the first fluid extraction conduits 302b through the fluid handling structure 307. There is a respective first fluid extraction conduit 302b for each first fluid extraction opening 302a. Each first fluid extraction conduit 302b may extend through the fluid handling structure 307 with a substantially constant cross-section. Although not shown for all of the fluid openings 301a, 302a, 303a and 305a in FIG. 3C, there is a respective fluid conduit 301b, 302b, 303b and 305b for each fluid opening 301a, 302a, 303a and 305a and each fluid conduit 301b, 302b, 303b and 305b may extend through the fluid handling structure 307 with a substantially constant cross-section.

The fluid handling structure 307 as described above may be time consuming, difficult and expensive to manufacture. In particular, it may be time consuming to manufacture the damper surface 308 and fluid opening 301a, 302a, 303a and 305a definitions to the required level of planarity, roughness and to meet the dimensional tolerances. It is also expensive and time consuming to repair, or re-work, damaged surfaces in the event of a collision between the fluid handling structure 307 and the substrate W, or scratches occurring. In some applications, the damper surface 308 may be coated. The coating may have a limited lifetime due to scratching, aging and/or contamination, and the process of replacing the coating may be difficult and expensive. The lack of availability of the lithographic apparatus during maintenance of an fluid handling structure 307 also increases costs.

There is a general need to improve the availability of a lithographic apparatus and to reduce the maintenance costs of an fluid handling structure.

Embodiments of the present invention may help improve the availability of a lithographic apparatus and reduce the maintenance cost of an fluid handling structure. Disclosed herein are various embodiments of an fluid handling structure which may be used in all types of localised immersion lithography apparatus.

Figure 4A:
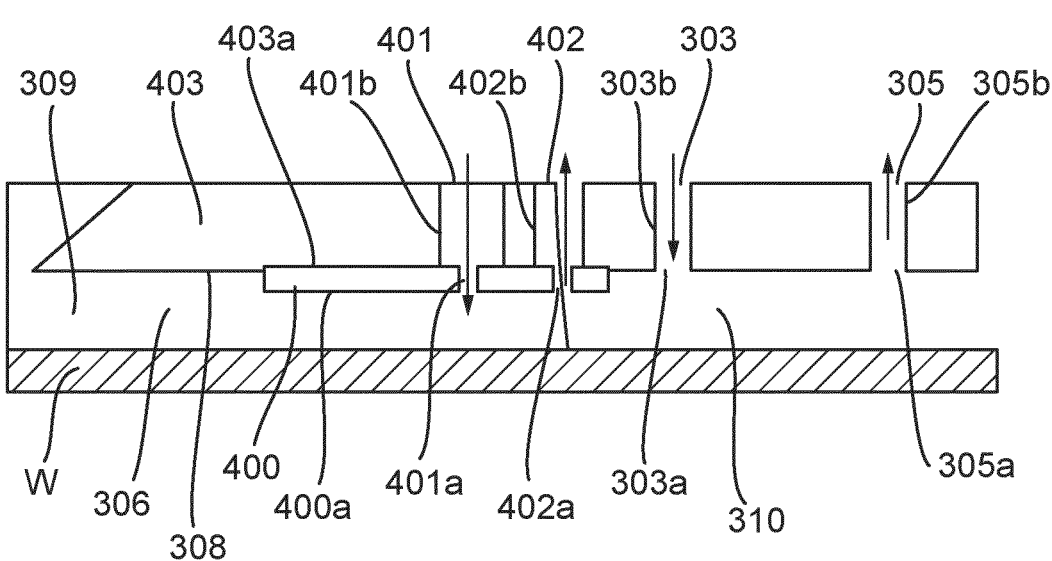
FIGS. 4A and 4B show part of an fluid handling structure according to a first embodiment.
Figure 4B:
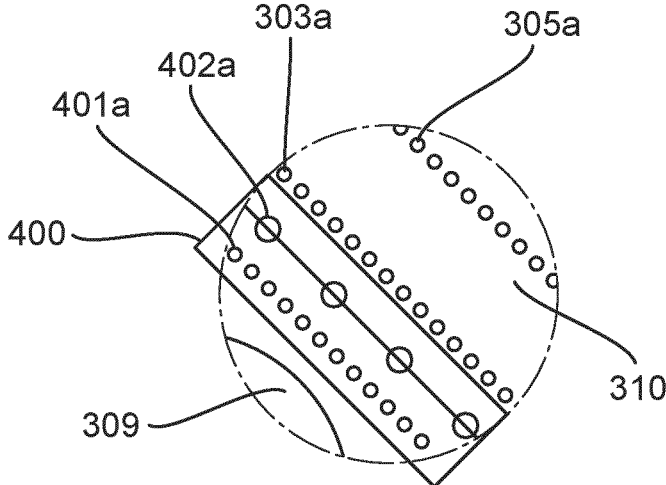

As described in detail below, embodiments provide a fluid handling system with an fluid handling structure that comprises one or more replaceable plates. Each plate comprises at least some of the fluid openings. An outer surface of each plate provides at least some of the damper surface 308. Advantageously, the maintenance of the fluid handling structure may only require the relatively straightforward operation of removing a plate and securing a new, or reconditioned, plate to the fluid handling structure. This may reduce the time and cost of servicing the fluid handling structure and increase the availability of the lithographic apparatus. Advantages of embodiments may include easier manufacturability of the fluid handling structure, better protection of the main body of the fluid handling structure, as well as quicker and cheaper turn-around time in production and repair/rework FIGS. 4A and 4B show part of an fluid handling structure 403 according to a first embodiment. The fluid handling structure 403 comprises a plate support member 403a and a replaceable plate 400. The plate support member 403a is part of the main body of the fluid handling structure 403 and the plate 400 is secured to the plate support member 403*a*.

As described earlier, there is a channel 306 between the fluid handling structure 403 and the substrate W. The channel 306 may comprise immersion liquid 309 and/or gas 310.

The fluid handling structure 403 comprises a first fluid supply member 401. The first fluid supply member 401 comprises a first fluid supply conduit 401*b* that is an opening through the main body of the fluid handling structure 403. The first fluid supply member 401 also comprises a first fluid supply opening 401*a* that is an opening through the plate 400.

The fluid handling structure 403 comprises a first fluid extraction member 402. The first fluid extraction member 402 comprises a first fluid extraction conduit 402*b* that is an opening through the main body of the fluid handling structure 403. The first fluid extraction member 402 also comprises a first fluid extraction opening 402*a* that is an opening through the plate 400.

The fluid handling structure 403 may optionally comprise a second fluid supply member 303 and a second fluid extraction member 305. These may be substantially as described earlier with reference to FIGS. 3A to 3C.

The plate 400 may have a substantially planar structure. An outer surface 400*a* of the plate 400, that is a major surface of the plate 400, may be a surface of the channel 306. The outer surface 400*a* of the plate 400 may provide at least part of the damper surface 308 of the fluid handling structure 403.

The plate support member 403*a* may comprise a cavity in the main body of the fluid handling structure 403 for receiving the plate 400. The plate 400 may be entirely received within the cavity so that the outer surface 400*a* of the plate 400 is flush with the damper surface 308 that is not comprised by the plate 400. Preferably, the plate 400 is only partially received by the cavity so that part of the plate 400 protrudes from the damper surface 308 that is not comprised by the plate 400. The outer surface 400*a* of the plate 400 may therefore be closer to the substrate W than the damper surface 308 surrounding the plate 400. For example, the damper surface 308 surrounding the plate 400 may be about 10 μm to 200 μm further from the substrate W than the outer surface 400*a* of the plate 400. Advantageously, when the channel 306 width is reduced by the plate 400, the plate 400 may be the only part of the fluid handling structure 403 that is damaged if there is a collision with the substrate W, or any other surface in close proximity to the fluid handling structure 403. Repairing the fluid handling structure 403 after such a collision may only require replacing the plate 400.

FIG. 4B shows a plan view of the plate 400 when it is secured to the fluid handling system. In a similar arrangement to that shown in FIGS. 3A to 3C, there may be a plurality of fluid openings 401*a*, 402*a*, 303*a* and 305*a*. The plurality of fluid openings 401*a*, 402*a*, 303*a* and 305*a* may be arranged in a plurality of different sets of openings.

Each set comprising a plurality of fluid openings 401*a*, 402*a*, 303*a* and 305*a* may comprise fluid openings arranged around a mid-point of the liquid confinement space. The plurality of fluid openings 401*a*, 402*a*, 303*a* and 305*a* may be arranged in any of a circular, square, rectangular or star configuration, or any combination thereof. The fluid handling system may have two sides facing opposite sides of projection lens. The mid-point of the liquid confinement space may be the space directly under the projection lens.

A first set of fluid openings in the plate 400 may comprise a plurality first fluid supply openings 401*a*. A second set of fluid openings in the plate 400 may comprise a plurality first fluid extraction openings 402*a*. The second set of fluid openings may be arranged further away from the beam path of the radiation beam B than the first set of fluid openings.

As shown in FIG. 4A (and also described later with reference to FIG. 5C), the first fluid supply conduit 401*b* may have a different size and/or shape in cross-section than the first fluid supply opening 401*a*. In particular, the cross-sectional dimension, e.g. width, of the first fluid supply conduit 401*b* may be substantially larger than the largest cross-sectional dimension, e.g. diameter. of the first fluid supply opening 401*a*. In addition, a single first fluid supply conduit 401*b* may supply fluid through a plurality of fluid supply openings 401*a*. The first fluid supply conduit 401*b* may be slot/slit shaped. For example, it may have a substantially rectangular cross-section in a plane parallel to the damper surface 308. Any fluid blockages are therefore expected to occur in the first fluid supply openings 401*a* and not the first fluid supply conduit 401*b*.

Similarly, the first fluid extraction conduit 402*b* may have a different size and/or shape in cross-section than the first fluid extraction opening 402*a*. In particular, the width of the first fluid extraction conduit 402*b* may be substantially larger than the diameter of the first fluid extraction opening 402*a*. In addition, a single first fluid extraction conduit 402*b* may extract fluid through a plurality of fluid extraction openings 402*a*. The first fluid extraction conduit 402*b* may be slot/slit shaped. For example, it may have a substantially rectangular cross-section in a plane parallel to the damper surface 308. Any fluid blockages are therefore expected to occur in the first fluid extraction openings 402*a* and not a first fluid extraction conduit 402*b*.

As described earlier, the use of the lithographic apparatus may result in contamination and/or damage occurring to the fluid handling structure 403. For example, contaminant particles, such as resist flakes, may block some of the fluid openings 401*a*, 402*a*, 303*a* and 305*a* and the fluid openings 401*a*, 402*a*, 303*a* and 305*a* may need to be cleared. Scratches may also occur on the damper surface 308.

Servicing the fluid handling structure 403 may comprise removing the plate 400 from the fluid handling structure 403 and replacing the plate 400 with a new plate 400. The replacement plate 400 may be a completely new plate 400, or a plate 400 that has been used before and then suitably reconditioned. The fluid handling structure 403 may be removed from the lithographic apparatus in order for a plate 400 to be removed and a new plate 400 secured to the fluid handling structure 403. Alternatively, the fluid handling structure 403 may remain in the lithographic apparatus when the plate 400 is replaced.

Some of the fluid openings 401*a*, 402*a*, 303*a* and 305*a* may be more likely to be blocked by contaminants than other. In particular, the fluid openings 401*a* and 402*a* in the plate 400, through which immersion liquid 309 flows, may be the most likely to be blocked by contaminants. The outer surface 400*a* of the plate 400 may be the closest surface of the fluid handling structure 403 to the substrate W. The outer surface 400*a* of the plate 400 may therefore more likely to be damaged, such as scratched, than any other part of the damper surface 308. Accordingly, the only part of the fluid handling structure 403 that requires maintenance may be in the plate 400. The other parts of the fluid handling structure 403 may require a lot less maintenance. Advantageously, the maintenance of the fluid handling structure 403 may only require replacing the plate 400. Any maintenance that is required of the other parts of the fluid handling structure 403 may be performed relatively easily, quickly and cheaply. For example, the other parts of the fluid handling structure 403 may only need to be cleaned and the entire fluid handling structure 403 may not need to be sent away for re-working and re-qualification. The use of a replaceable plate 400 may therefore substantially reduce the time and cost of servicing the fluid handling structure 403.

Another advantage of the use a replaceable plate is that the same fluid handling structure 403 may be used with plates 400 that have different arrangements of fluid openings. The fluid handling structure 403 may therefore be reconfigurable.

The plate 400 may be secured to the plate support member 403a by any of a number of techniques. For example, the plate 400 may be secured to the plate support member 403a by one or more of: screw(s), bolt(s), an adhesive, magnetic forces, capillary forces, electro-static forces or van der Waals forces. In particular, a liquid proofing adhesive/gel, or other liquid proofing substance, may be used in addition to screws to ensure that the edges of the plate 400 is liquid tight.

The technique used to secure the plate 400 to the plate support member 403a should not damage, or substantially alter, any part of the fluid handling structure 403 both when the plate 400 is secured to the plate support member 403a, and when the plate 400 is removed from the plate support member 403a. Accordingly, techniques such as welding the plate 400 to the plate support member 403a would not be appropriate since the plate would not achieve its intended purpose. A welded plate 400 is difficult to attach, difficult to remove, and the removal process may damage both the fluid handling structure 403 and the plate 400.

The manufacture of a plate 400 may be easier than the manufacture of a known fluid handling structure 307. For example, making small fluid openings may be easier in a thin plate 400 than in an fluid handling structure 307.

The plate 400 may comprise a metal, such as steel. In particular, the plate 400 may be a metal foil. The plate 400 may be made using laser ablation, laser cutting or electron or ion-beam machining. The plate 400 may be made from a low cost material, such as a foil, so that rejected plates are not a substantial cost. Surface finishing, such as lapping, may not be required if a shiny metal foil is used as a starting material. Some of the manufacturing steps in known techniques for manufacturing an fluid handling structure may not be required.

The plate 400 may comprise a plastic material.

The plate 400 thickness may be between 5 μm and 5 mm, and is preferably between 10 μm and 2 mm, and more preferably between 10 μm and 100 μm.

The outer surface 400a of the plate 400, that is part of the damper surface 308, may be coated. For example, the outer surface 400a of the plate 400 may be coated with a hydrophobic coating. Alternatively, the outer surface 400a of the plate 400 may be coated with a hydrophilic, or other type, coating. An advantage of using a replaceable plate 400 is that the coating may be changed, such as may be required when the coating is at the end of its lifetime, by replacing the plate 400.

Embodiments include the use of a plate 400 that is a micro-sieve.

Embodiments include the use of a plate 400 that is a porous member.

Figure 5A:
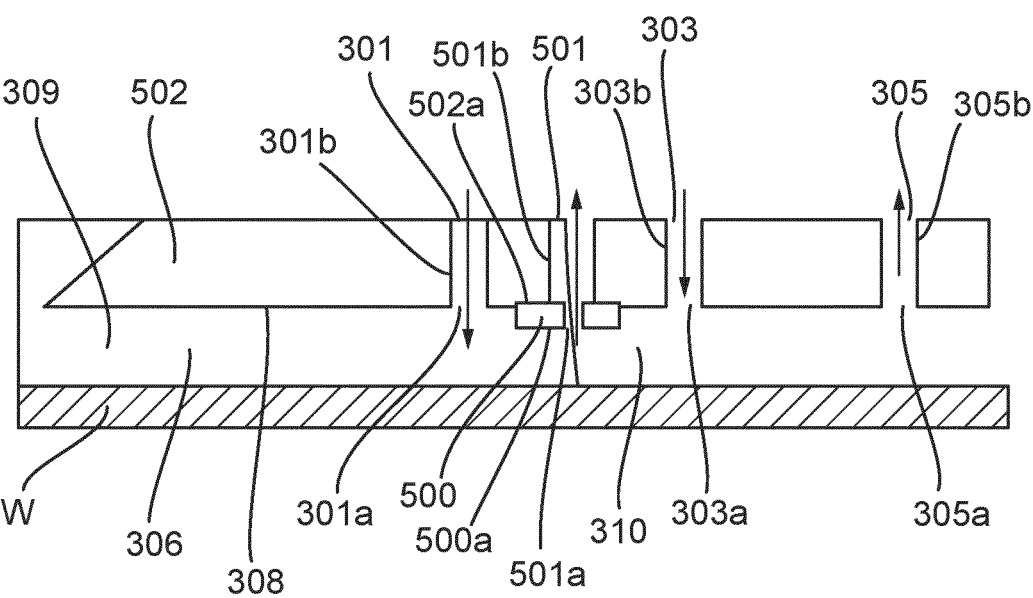
FIGS. 5A, 5B and 5C show part of an fluid handling structure according to a second embodiment.
Figure 5B:
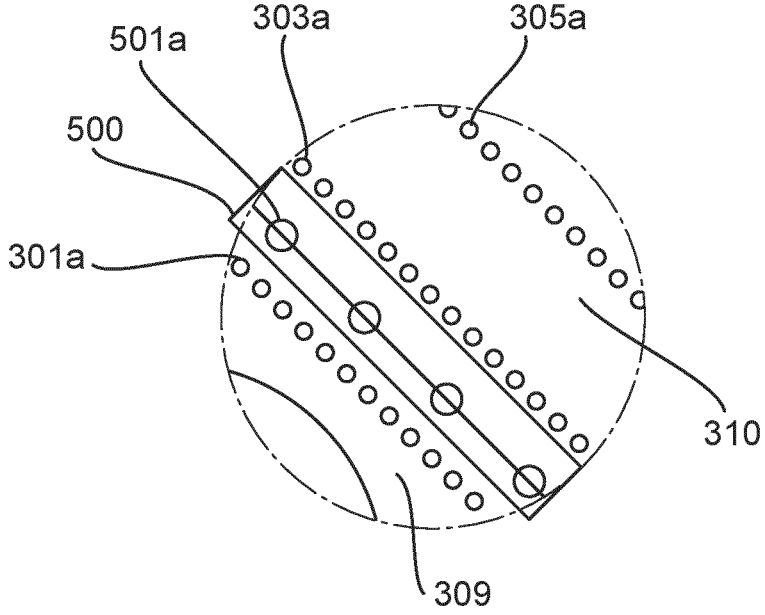
Figures 5C, 6:
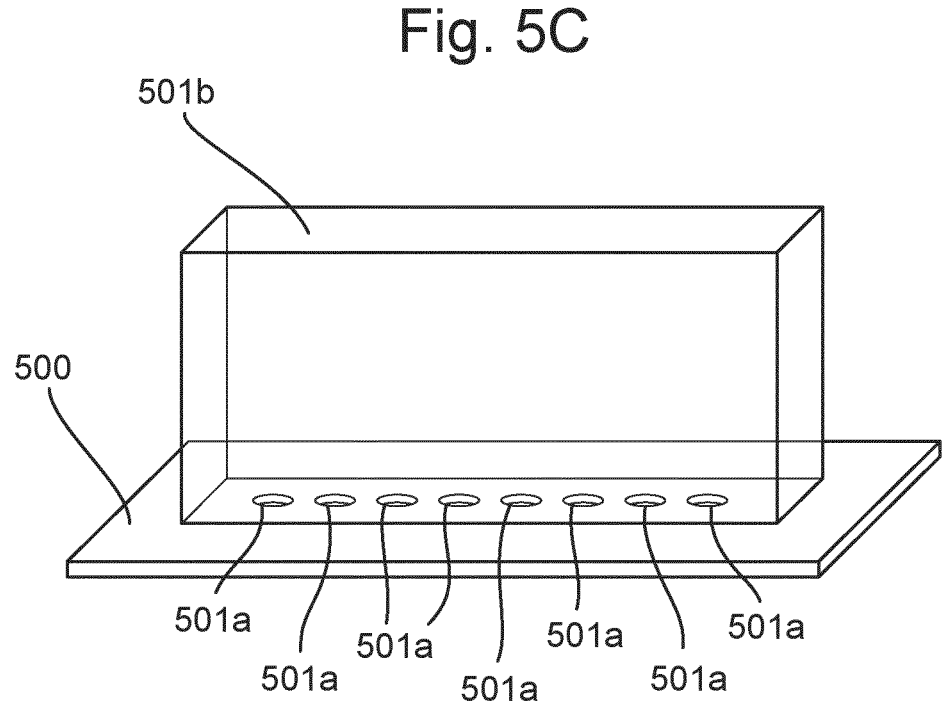
FIG. 6 shows a damper surface according to a third embodiment.

FIGS. 5A, 5B and 5C show part of an fluid handling structure 502 according to a second embodiment. The second embodiment differs from the first embodiment by the plate 500 only comprising fluid extraction openings.

In the second embodiment, the fluid handling structure 502 comprises a plate support member 502a and a replaceable plate 500. The plate support member 502a is part of the main body of the fluid handling structure 502 and the plate 500 is secured to the plate support member 502a.

As described earlier, there is a channel 306 between the fluid handling structure 502 and the substrate W. The channel 306 may comprise immersion liquid 309 and/or gas 310.

The fluid handling structure 502 may comprise a first fluid supply member 301, second fluid supply member 303 and a second fluid extraction member 305. These may be substantially as described earlier with reference to FIGS. 3A to 3C.

The fluid handling structure 502 also comprises a first fluid extraction member 501. The first fluid extraction member 501 comprises a first fluid extraction conduit 501b that is an opening through the main body of the fluid handling structure 502. The first fluid extraction member 501 also comprises a first fluid extraction opening 501a that is an opening through the plate 500.

As described for the first embodiment, an outer surface 500a of the plate 500 is a surface of the channel 306. The outer surface 500a of the plate 500 may provide at least part of the damper surface 308 of the fluid handling structure 502. The plate support member 502a may comprise a cavity in the main body of the fluid handling structure 502 for receiving the plate 500. The plate 500 may be entirely received within the cavity so that the outer surface 500a of the plate 500 is flush with the damper surface 308 that is not comprised by the plate 500. Preferably, the plate 500 is only partially received by the plate support member 502a so that part of the plate 500 protrudes from the damper surface 308 that is not comprised by the plate support member 502a. The outer surface 500a of the plate 500 may therefore be closer to the substrate W that the damper surface 308 surrounding the plate 500. Advantageously, when the channel 306 width is reduced by the plate 500, the plate 500 may be the only part of the fluid handling structure 502 that is damaged if there is a collision with the substrate W, or any other surface in close proximity to the fluid handling structure 502. Repairing the fluid handling structure 502 after such a collision may only require replacing the plate 500.

FIG. 5B shows a plan view of the plate 500 when it is secured to the fluid handling system. In a similar arrangement to that shown in FIGS. 3A, 3B, 3C, 4A and 4B, there may be a plurality of fluid openings 301a, 501a, 303a and 305a. The plurality of fluid openings 301a, 501a, 303a and 305a may be arranged in a plurality of different sets of openings.

As shown in FIG. 5C, the first fluid extraction conduit 501b may have a different size and/or shape in cross-section than the first fluid extraction opening 501a. In particular, a single first fluid extraction conduit 501b may extract fluid through a plurality of fluid extraction openings 501a. The first fluid extraction conduit 501b may have a substantially rectangular cross-section in a plane parallel to the damper surface 308. In addition, the width of the first fluid extraction conduit 501b may be substantially larger than the diameter of the first fluid extraction opening 501a.

The second embodiment provides similar advantages to the first embodiment. In particular, the servicing of the fluid handling structure 502 may only require replacing the plate 500. The plate 500 of the second embodiment therefore provides the advantage of reducing the servicing time of the fluid handling structure 502. The blocking of openings by contaminants may mostly occur in the liquid extraction openings and these are all comprised by the plate 500.

A damper surface according to third embodiment is shown in FIG. 6. Although the third embodiment is shown as a technique applied to the first embodiment, the technique of the third embodiment may be applied with either of the first or second embodiments.

In the third embodiment, all of the fluid openings may be arranged in the same plate. The plate 400 may, in plan view, be any hollow shape, such as a hollow square. The plate 400 comprises a aperture arranged so that, when the plate 400 is secured to the fluid handling structure 403, the beam path of a radiation beam B may pass through the aperture. The fluid openings may extend around the aperture.

Figure 7:
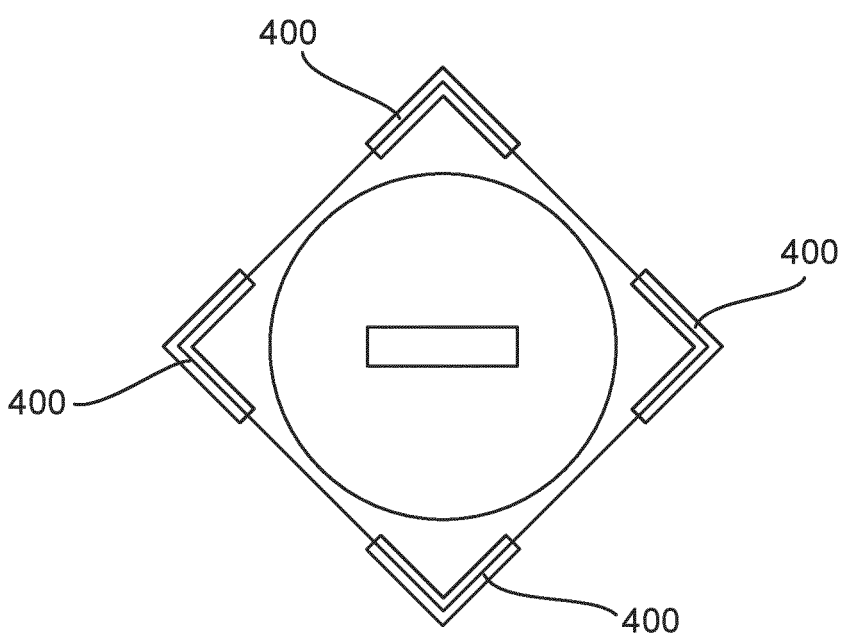
FIG. 7 shows a damper surface according to a fourth embodiment.

A damper surface according to a fourth embodiment is shown in FIG. 7. Although the fourth embodiment is shown as a technique applied to the first embodiment, the technique of the fourth embodiment may be applied with either of the first or second embodiments.

In the fourth embodiment, there are a plurality of replaceable plates 400. Each plate 400 may be a plate 400 according to the above described first or second embodiments. Accordingly, each plate 400 may comprise a plurality of fluid openings. An outer surface 500a of each plate 400 may be a boundary surface between the fluid handling system and the channel 306, i.e. part of a damper surface 308.

The plurality of plates 400 may all be securable to the same plate support member 403a.

As shown in FIG. 7, the plurality of plates 400 may be configured to surround the beam path of the radiation beam B. Each of the plurality of plates 400 may lie on what, in plan view, is part of a hollow shaped arrangement, such as a hollow square or circular arrangement, for surrounding the beam path. In particular, one or more of the plurality of replaceable plates 400 may be substantially pointed, such as L-shaped or V-shaped. One or more of the plurality of replaceable plates 400 may be C-shaped, crescent-shaped, moon-shaped or rectangle-shaped. Each plate may comprise a corner that is aligned with a scanning, or stepping, direction of the lithographic apparatus. As shown in FIG. 7, four L-shaped plates may provide the four corners of a square configuration of plates 400.

Advantageously, by using a plurality of plates 400, only the plates 400 that require replacing may be replaced when the fluid handling structure 403 is serviced.

Embodiments may be incorporated into any of the fluid handling systems shown in FIGS. 2a to 2d.

Embodiments include the presence and use of further features from those specifically described above. In particular, the fluid handling system of embodiments may include one or more pumps for controlling the fluid flows through any of the fluid supply or extraction members. One or pumps for controlling the fluid flows may additionally, or alternatively, be external to the fluid handling system.

Embodiments also include a number of modifications and variations to the above described techniques.

For example, in an second implementation of the second embodiment, the plate 500 may be arranged to only comprise fluid supply openings and no fluid extraction openings. The fluid supply openings comprised by the plate 500 may be part of one or more fluid supply members, and similar to the first fluid supply members 401 as described for the first embodiment.

In a third implementation of the second embodiment, the fluid handling structure may comprise one or more plates 500 that only comprise fluid extraction openings, as shown in FIGS. 5A to 5C, as well as one or more plates 500 that only comprise fluid supply openings, as in the second implementation of the second embodiment. Advantageously, when the fluid handling structure is serviced, only the plates 500 that require replacing may be replaced.

Embodiments include the use of one or more plates 400 with each plate 400 comprising any number of sets of fluid extraction openings and any number of sets of fluid supply openings.

In the figures, all of the fluid openings in each plate and damper surface are circular. Embodiments more generally include any of the fluid openings having any shape. For example, some of the fluid openings may be square or have an irregular shape.

Embodiments also include the fluid handling structure 307, 403, 502 comprising one or more bumper plates (not depicted in the drawings). Similar to each plate comprising fluid openings, each bumper plate may be arranged on a channel 306 facing surface of the fluid handling structure 307, 403, 502. An outer surface of each bumper plate may provide a boundary surface between the fluid handling system and the channel 306.

Each outer surface may be part of the damper surface 308. The bumper plates may not comprise any fluid openings or be connected to any conduits. Each bumper plate comprise a metal, rubber and/or a plastics material. The internal structure of each bumper plate may be a substantial honeycomb.

The outer surfaces of the bumper plates may be arranged so that they provide the minimum separation across the channel 306 between the fluid handling structure 307, 403, 502 and the substrate W. The purpose of the bumper plates is that they provide the first part of the fluid handling structure 307, 403, 502 to hit the substrate W in event of a collision if, in use, the separation between the fluid handling structure 307, 403, 502 and the substrate W reduces to below tolerable levels. Any damage caused by the collision therefore may only be to the one or more bumper plates, and/or the substrate W, and not to other parts of the fluid handling structure 307, 403, 502.

In the above described embodiments, the plate 400, 500 is shown as providing an upper surface of the channel 306. The plate 400, 500 will provide an upper surface of the channel 306 in the typical configuration of the substrate W being arranged horizontally. However, embodiments more generally include the plate 400, 500 providing a surface of the fluid handling system that is substantially parallel to the surface of the substrate W. The surface of the substrate W is not restricted to being arranged horizontally.

The present invention may provide a lithographic apparatus. The lithographic apparatus may have any/all of the other features or components of the lithographic apparatus as described above. For example, the lithographic apparatus may optionally comprise at least one or more of a source SO, an illumination system IL, a projection system PS, a substrate support WT, etc.

Specifically, the lithographic apparatus may comprise the projection system PS configured to project the radiation beam B towards the region of the surface of a substrate W. The lithographic apparatus may further comprise the fluid handling system as described in any of the above embodiments and variations.

The lithographic apparatus may comprise an actuator configured to move the substrate W relative to the fluid handling system. Thus, the actuator may be used to control the position of the substrate W (or alternatively, the position of the fluid handling system). The actuator could be, or could comprise, the substrate support (e.g., a substrate table) WT and/or a substrate holder constructed to hold the substrate W and/or the second positioner PW configured to accurately position the substrate support WT.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented by instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use ambient (non-vacuum) conditions.

Although specific reference may have been made above to the use of embodiments of the invention in the context of optical lithography, it will be appreciated that the invention, where the context allows, is not limited to optical lithography.

Embodiments include the following numbered clauses:

1. A fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a replaceable plate with an outer surface that comprises a plurality of fluid openings configured for supply and/or extraction of immersion liquid and/or gas in a channel between the fluid handling system and the substrate; wherein the outer surface is coated.

2. A fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a plurality of replaceable plates; wherein each plate comprises an outer surface that comprises a plurality of fluid openings configured for supply and/or extraction of immersion liquid and/or gas in a channel between the fluid handling system and the substrate.

3. The fluid handling system according to clause 1 or 2, further comprising a plate support member configured so that each plate is both securable to and removable from the plate support member.

4. The fluid handling system according to clause 3, wherein each plate is secured to the plate support member by one or more of: screw(s), an adhesive, magnetic forces, capillary forces or electro-static forces.

5. The fluid handling system according to clause 3 or 4, wherein the plate support member comprises one or more conduits configured to supply fluid to, or extract fluid from, the one or more fluid openings of each plate.

6. The fluid handling system according to clause 5, wherein a conduit of the plate support member is configured to supply fluid to, or extract fluid from, a plurality of fluid openings of a plate.

7. The fluid handling system according to clause 5 or 6, wherein, in a plane perpendicular to the flow path of fluid through one or more of the fluid openings, each conduit has a substantially rectangular cross-section.

8. The fluid handling system according to any of clauses 3 to 7, wherein the plate support member comprises a cavity configured to receive at least part of at least one plate.

9. The fluid handling system according to clause 8, wherein, when at least one plate is secured to the fluid handling system, part of the at least plate protrudes from the cavity to thereby locally reduce the separation across the channel between the fluid handling system and the substrate.

10. The fluid handling system according to any preceding clause, wherein each plate is a substantially planar structure; and the outer surface of each plate is a major surface of the plate.

11. The fluid handling system according to any preceding clause, wherein a plurality of the fluid openings are configured to extract immersion liquid and/or gas from the channel.

12. The fluid handling system according to any preceding clause, wherein a plurality of the fluid openings configured to supply immersion liquid and/or gas to the channel.

13. The fluid handling system according to any preceding clause, wherein each plate comprises: a first set of fluid openings that are fluid supply openings; a second set of fluid openings that are fluid extraction openings; and the second set of fluid openings are arranged further away from the beam path of the radiation beam than the first set of fluid openings.

14. The fluid handling system according to any preceding clause, wherein the fluid openings are arranged around a mid-point of the liquid confinement space; and the fluid openings are optionally arranged in any of a circular, square, rectangular or star configuration, or any combination thereof.

15. The fluid handling system according to any preceding clause, wherein one or more plates comprise metal, such as steel.

16. The fluid handling system according to any preceding clause, wherein one or more plates comprise a metal foil.

17. The fluid handling system according to any preceding clause, wherein one or more plates comprise a plastic material.

18. The fluid handling system according to any preceding clause, wherein one or more plates has thickness between 5 μm and 5 mm, preferably between 10 μm and 100 μm.

19. The fluid handling system according to clause 2, or any clause dependent thereon, wherein the outer surface of one or more plates is coated.

20. The fluid handling system according to any preceding clause, wherein the outer surface of one or more plates is coated with a hydrophobic coating.

21. The fluid handling system according to any preceding clause, wherein the outer surface of one or more plates is coated with a hydrophilic coating.

22. The fluid handling system according to any preceding clause, wherein one or more plates comprise a micro-sieve.

23. The fluid handling system according to any preceding clause, wherein one or more plates comprise a porous member.

24. The fluid handling system according to clause 1, or any clause dependent thereon, wherein the plate comprises an aperture configured such that the beam path of the radiation beam passes through the aperture.

25. The fluid handling system according to clause 1, or any of clauses 3 to 23 when dependent on clause 1, wherein: the fluid handling system comprises a plurality of replaceable plates; all of the plates comprise an outer surface that comprises a plurality of fluid openings; and each outer surface is a boundary surface between the fluid handling system and the channel.

26. The fluid handling system according to clause 2, clause 25, or any preceding clause that is dependent on clause 2, wherein a plurality of the plates are attachable to the same plate support member.

27. The fluid handling system according to clause 2, clause 25, clause 26, or any preceding clause that is dependent on clause 2, wherein one or more of the plurality of plates is substantially pointed, such as L-shaped or V-shaped.

28. The fluid handling system according to clause 27, wherein each plate comprises a corner that is arranged so that it is aligned with a scanning or stepping direction of the lithographic apparatus.

29. The fluid handling system according to clause 2, any of clauses 25 to 28, or any preceding clause that is dependent on clause 2, wherein the plurality of plates are configured to surround the beam path of the radiation beam.

30. The fluid handling system according to clause 29, wherein the plurality of plates are configured to surround the beam path in a substantially square arrangement.

31. The fluid handling system according to any preceding clause, further comprising one or more bumper plates; wherein an outer surface of each bumper plate provides a boundary surface between the fluid handling system and the channel; and a surface of a bumper plate provides the minimum separation across the channel between the fluid handling system and the substrate.

32. The fluid handling system according to clause 31, wherein each bumper plate comprises metal, rubber and/or a plastics material.

33. A fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a replaceable plate for supply and/or extraction of immersion liquid and/or gas in a channel between the fluid handling system and the substrate; wherein the plate comprises a porous member.

34. A fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: one or more bumper plates; wherein an outer surface of each bumper plate provides a boundary surface between the fluid handling system and a channel between the fluid handling system and the substrate; and a surface of a bumper plate provides the minimum separation across the channel between the fluid handling system and the substrate.

35. A lithographic apparatus comprising the fluid handling system of any preceding clause.

36. The apparatus according to clause 34, further comprising a positioning system configured to move a substrate holder configured to support the substrate relative to the projection system in a plane substantially parallel to the surface of the substrate.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A fluid handling system for a lithographic apparatus, wherein the fluid handling system is configured to confine immersion liquid to a liquid confinement space between a part of a projection system and a surface of a substrate in the lithographic apparatus so that a radiation beam projected from the projection system can irradiate the surface of the substrate by passing through the immersion liquid, the fluid handling system comprising:

a replaceable plate with an outer surface that comprises a plurality of fluid openings configured for supply and/or extraction of immersion liquid and/or gas in a channel between the fluid handling system and the substrate; and a plate support member configured so that the plate is both securable to and removable from the plate support member, wherein the plate is a substantially planar structure and the outer surface of the plate is a major surface of the plate, and/or wherein the plate comprises:

a first set of fluid openings that are fluid supply openings; and a second set of fluid openings that are fluid extraction openings, wherein the second set of fluid openings are arranged further away from the beam path of the radiation beam than the first set of fluid openings.

2. The fluid handling system according to claim 1, wherein a conduit of the plate support member is configured to supply fluid to, or extract fluid from, a plurality of fluid openings of the plate, and/or wherein the plate is secured to the plate support member by one or more selected from: one or more screws, an adhesive, magnetic force, capillary force or electro-static force.

3. The fluid handling system according to claim 1, wherein the fluid openings are arranged around a mid-point of the liquid confinement space.

4. The fluid handling system according to claim 1, wherein the plate comprises metal and/or a plastic material, and/or wherein the plate has a thickness between 5 μm and 5 mm.

5. The fluid handling system according to claim 1, wherein the outer surface of the plate is coated with a hydrophobic coating and/or a hydrophilic coating, and/or wherein the plate comprises a micro-sieve and/or a porous member.

6. The fluid handling system according to claim 1, wherein the plate comprises an aperture configured such that the beam path of the radiation beam passes through the aperture.

7. The fluid handling system according to claim 1, wherein the plate comprises a corner that is arranged so that it is aligned with a scanning or stepping direction of the lithographic apparatus.

8. The fluid handling system according to claim 1, further comprising one or more bumper plates;
   wherein an outer surface of each bumper plate provides a boundary surface between the fluid handling system and the channel; and
   a surface of a bumper plate provides a minimum separation across the channel between the fluid handling system and the substrate.

9. The fluid handling system according to claim 8, wherein each bumper plate comprises metal, rubber and/or a plastics material.

10. A lithographic apparatus comprising the fluid handling system of claim 1.

11. A fluid handling system for a lithographic apparatus, wherein the fluid handling system is configured to confine immersion liquid to a liquid confinement space between a part of a projection system and a surface of a substrate in the lithographic apparatus so that a radiation beam projected from the projection system can irradiate the surface of the substrate by passing through the immersion liquid, the fluid handling system comprising:
   a replaceable plate with an outer surface that comprises a plurality of fluid openings configured for supply and/or extraction of immersion liquid and/or gas in a channel between the fluid handling system and the substrate; and
   a plate support member configured so that the plate is both securable to and removable from the plate support member,
   wherein, when the plate is secured to the fluid handling system, part of the plate protrudes from a structure of the fluid handling system to locally reduce a separation across the channel between the fluid handling system and the substrate, and
   wherein the plate is a substantially planar structure and the outer surface of the plate is a major surface of the plate, and/or wherein the plate comprises:
      a first set of fluid openings that are fluid supply openings; and a second set of fluid openings that are fluid extraction openings,
      wherein the second set of fluid openings are arranged further away from the beam path of the radiation beam than the first set of fluid openings.

12. The fluid handling system according to claim 11, wherein the plate comprises:
   a first set of fluid openings that are fluid supply openings;
   a second set of fluid openings that are fluid extraction openings,
      wherein the second set of fluid openings are arranged further away from the beam path of the radiation beam than the first set of fluid openings.

13. The fluid handling system according to claim 11, wherein the plate comprises an aperture configured such that the beam path of the radiation beam passes through the aperture.

14. A lithographic apparatus comprising the fluid handling system of claim 11.

15. A fluid handling system for a lithographic apparatus, wherein the fluid handling system is configured to confine immersion liquid to a liquid confinement space between a part of a projection system and a surface of a substrate in the lithographic apparatus so that a radiation beam projected from the projection system can irradiate the surface of the substrate by passing through the immersion liquid, the fluid handling system comprising:
   a plurality of replaceable plates, wherein each plate of the plurality of replaceable plates comprises an outer surface that comprises a plurality of fluid openings configured for supply and/or extraction of immersion liquid and/or gas in a channel between the fluid handling system and the substrate; and
   a plate support member configured so that each plate is both securable to and removable from the plate support member,
   wherein at least one of the plates is a substantially planar structure and the outer surface of the at least one plate is a major surface of the at least one plate, and/or wherein at least one of the plates comprises:
      a first set of fluid openings that are fluid supply openings; and
      a second set of fluid openings that are fluid extraction openings,
      wherein the second set of fluid openings are arranged further away from the beam path of the radiation beam than the first set of fluid openings.

16. The fluid handling system according to claim 15, wherein:
   the outer surface of one or more of the plates is coated, and/or
   the plurality of the plates are attachable to the same plate support member, and/or
   one or more of the plurality of plates is substantially pointed, and/or
   the plurality of plates are configured to surround the beam path of the radiation beam.

17. The fluid handling system according to claim 15, wherein all of the plates comprise an outer surface that comprises a plurality of fluid openings and each outer surface is a boundary surface between the fluid handling system and the channel.

18. The fluid handling system according to claim 15, wherein a conduit of the plate support member is configured to supply fluid to, or extract fluid from, a plurality of fluid openings of at least one plate of the plurality of plates.

19. The fluid handling system according to claim 15, wherein at least one plate of the plurality of plates comprises metal and/or a plastic material, and/or wherein at least one plate of the plurality of plates has a thickness between 5 μm and 5 mm.

20. A lithographic apparatus comprising the fluid handling system of claim 15.

\* \* \* \* \*